United States Patent [19]

Singlevich

[11] Patent Number: 5,384,278
[45] Date of Patent: Jan. 24, 1995

[54] TIGHT CONTROL OF RESISTOR VALVES IN A SRAM PROCESS

[75] Inventor: Scott G. Singlevich, Colorado Springs, Colo.

[73] Assignee: United Technologies Corporation, Hartford, Conn.

[21] Appl. No.: 271,544

[22] Filed: Jul. 7, 1994

Related U.S. Application Data

[63] Continuation of Ser. No. 976,696, Nov. 16, 1992, abandoned.

[51] Int. Cl.⁶ ............................................. H01L 21/70
[52] U.S. Cl. ......................................... 437/52; 437/47; 437/48; 437/60; 437/919
[58] Field of Search .................. 437/47, 48, 52, 60, 437/918; 257/537, 904

[56] References Cited

U.S. PATENT DOCUMENTS

| | | | |
|---|---|---|---|
| 4,178,674 | 12/1979 | Liu et al. | 437/48 |
| 4,277,881 | 7/1991 | Godejahn | 437/52 |
| 4,397,077 | 8/1983 | Denbenwick et al. | 437/48 |
| 4,408,385 | 10/1983 | Mohan Rao et al. | 437/52 |
| 4,416,049 | 11/1983 | McElmoy | 437/48 |
| 4,849,366 | 7/1989 | Hsu et al. | 437/45 |
| 4,868,135 | 9/1989 | Ogura et al. | 437/45 |

FOREIGN PATENT DOCUMENTS

| | | | |
|---|---|---|---|
| 0045076 | 4/1981 | Japan | 437/45 |
| 0078853 | 4/1987 | Japan | 437/233 |
| 0144671 | 6/1989 | Japan . | |
| 8202283 | 7/1982 | WIPO | 437/43 |

*Primary Examiner*—Tom Thomas

[57] ABSTRACT

A method of forming a polycrystalline silicon resistor includes the step of forming a resistor region of poly, the region being doped per a desired resistivity of the resistor. The exposed top and side portions of the poly region are completely covered with an insulating oxide. A predetermined portion of the oxide is etched away, resulting in a portion of the oxide completely covering the resistor poly. The resistor poly region and oxide are covered (masked) with photoresist, the mask extending beyond the sides of the poly. The remaining oxide in the area outside of the mask is etched away, and the photoresist is removed.

20 Claims, 2 Drawing Sheets

TIGHT CONTROL OF RESISTOR VALVES IN A SRAM PROCESS

This application is a continuation of application Ser. No. 07/976,696 filed on Nov. 16, 1992, now abandoned.

TECHNICAL FIELD

The invention relates to semiconductor manufacturing processes, and more particularly to a semiconductor memory device manufacturing process providing tight control of values of resistors within the memory device.

BACKGROUND ART

In the art of semiconductor integrated circuit memory device planar manufacturing, it is known to fabricate individual memory cell resistors using polycrystalline silicon ("poly") of an appropriate doping. This is true for static random access memory ("SRAM") devices. SRAMs allow for both data storage (i.e., writing) and data retrieval (i.e., reading) of its memory cells in random order independent of the physical locations of the cells. In a particular SRAM design having two load resistors in a single SRAM cell, both resistors typically comprise doped poly. The layer of poly in which the resistors are formed usually comprises a second layer of poly; a first layer of poly being used to form, inter alia, the gates of the four transistors in a typical SRAM cell. See Wolf, S., "Silicon Processing For The VLSI Era, Vol II, Process Integration" 1990 pp 567–583.

In U.S. Pat. No. 5,141,597 to Adams et al. and assigned to same assignee as that of the present invention, there is described a process of forming thin polysilicon resistors preferably in the first level of poly (i.e., in the same level of poly as the transistor gates). However, the invention in Adams et al. may be applied to a second level of poly, if desired. (Column 2, lines 3–10). The invention in Adams et al. relates to a method of forming poly resistors in which the resistor area is defined and initially etched down to an appropriate thickness less than the thickness of the poly interconnect regions. Both the resistor and interconnect regions are doped and defined by patterning and etching steps.

Adams et al. allude to the fact that subsequent steps are needed to form the poly resistors beyond those described and claimed in detail therein. (Column 2, lines 41–46). It was discovered that during such a subsequent step (i.e., of further resistor patterning and etching), a portion of the poly resistor region was undesirably removed. This had a profound effect on the resistor value. The result was a very poor resistor manufacturing yield to specification.

Specifically, a spacer oxide comprising, e.g., silicon oxide, was formed over the entire single layer of poly, including the poly resistor region. The spacer oxide was then etched to clear all of the oxide off the poly. This was done by setting an etch endpoint, and then overetching to account for non-uniformities. During this process, the selectivity to the poly became very critical in reference to control of the poly resistor thickness. It was found that the etch endpoint and selectivity were not adequate to control the resistor values. Thus, it was difficult to yield SRAMs having resistor values within specification.

The specification is strict due to the fact that poly resistors have a high temperature coefficient. This results in a wide range of the timing of the write pulse to the SRAM cell when operating over the entire military temperature range. Since SRAMs must be designed to operate with this wide range in pulse width and wide range in resistivity, it is critical that an accurate resistance value be provided for the SRAM load resistors.

DISCLOSURE OF INVENTION

An object of the present invention is to provide a manufacturing process for SRAM poly resistors in which the resulting resistor values can be controlled accurately and repeatedly from device to device.

Another object of the present invention is to provide a semiconductor integrated circuit manufacturing process in which a region having been fabricated with desired characteristics maintains those characteristics throughout the remaining steps in the manufacturing process.

According to the present invention, a method of forming a polycrystalline silicon resistor includes the step of forming a region of poly comprising the resistor, the poly region being doped per a desired resistivity of the resistor; the exposed top and side portions of the poly region are completely covered with an insulating oxide; a predetermined portion of the oxide is etched away, resulting in a portion of the oxide completely covering the resistor poly; the oxide above the resistor poly region is covered (masked) with photoresist, the mask extending beyond the sides of the resistor poly region; the remaining oxide in the area outside of the mask is etched away, and the photoresist is removed.

By only etching away a portion of the spacer oxide surrounding the resistor poly, the present invention insures that none of the poly is undesirably removed in further processing steps. Thus, the problems with the aforedescribed prior art approach relating to the resulting uncontrolled variance of resistor values is solved. The result is more accurate and repeatable resistor values.

The present invention has utility in the field of semiconductor integrated circuit memory device manufacturing. It provides for an easily implementable variation to an existing manufacturing process. The method of the present invention is implemented with an existing mask, and the improvements to resulting resistor control and variability are dramatic. The method may be used to form load resistors for MOS or bipolar SRAMs.

These and other objects, features and advantages of the present invention will become more apparent in light of the detailed description of a best mode embodiment thereof, as illustrated in the accompanying drawings.

BEST MODE FOR CARRYING OUT THE INVENTION

Figure 1:
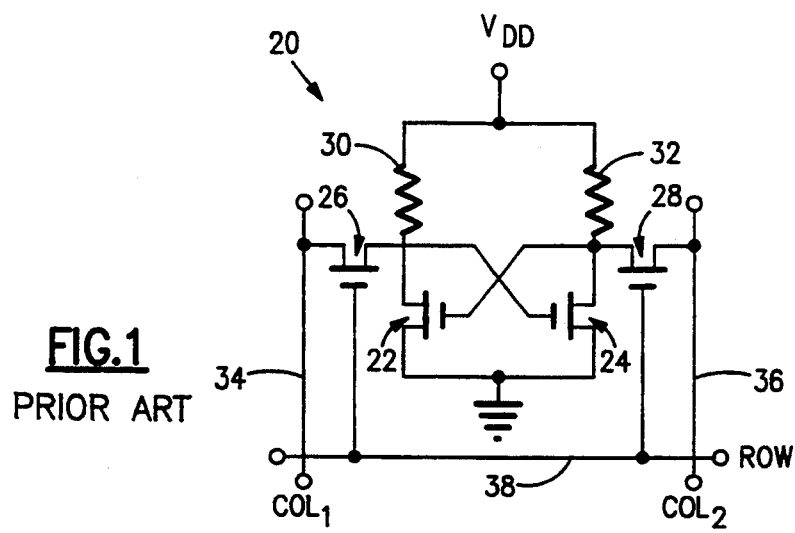
FIG. 1 is a schematic illustration of a SRAM cell having two load resistors.

Referring to FIG. 1, there illustrated is a schematic of the well-known four transistor SRAM cell 20 configuration. The SRAM 20 may be fabricated using MOS or bipolar technologies. Two transistors 22,24 are arranged as a pair of cross-coupled inverters in the well known flip-flop configuration. The flip-flop stores the bit state of the cell 20. Two other transistors 26,28 are access transistors. Two load resistors 30,32 are provided along with a pair of column signal lines 34,36 and a row signal line 38. The load resistors 30,32 are fabricated according to the method of the present invention.

Referring to FIGS. 2–7, there is shown a sequence of cross-sectional figures depicting the steps of the present invention in fabricating either one of the two load resistors 30,32 of the SRAM cell 20 of FIG. 1. It is to be understood that the other resistor in the SRAM cell may be fabricated using the identical technique described with respect to FIGS. 2–7. FIGS. 2–7 illustrate the steps in manufacturing one resistor in one SRAM cell fabricated on an integrated circuit typically containing thousands of such cells, each cell containing two such resistors, as shown in FIG. 1. Thus, the description hereinafter with respect to FIGS. 2–7 is applicable to fabrication of every poly resistor on the SRAM.

Figure 2:
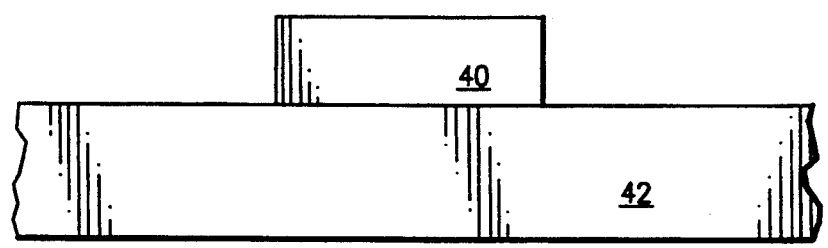
FIGS. 2–7 are cross-sectional illustrations of one of the two load resistors of FIG. 1 at various steps in the method of the present invention.

FIG. 2 illustrates a region 40 of poly comprising the desired resistor. The poly region 40 is deposited and patterned using known techniques on top of an insulating layer 42 comprising, e.g., silicon oxide. The insulating layer 42 may be of any desired thickness, for example, 7000 Angstroms. The poly is deposited to a thickness of, e.g., 4500 Angstroms, using known techniques. The poly is doped using known dopants and techniques to achieve a desired resistivity. Further, the poly is then patterned and etched down to a thickness of, e.g., 3000 Angstroms to define the resistor areas.

The broadest scope of the present invention is not concerned with how the poly is deposited and patterned to achieve the region 40 of FIG. 2. For example, if desired, the poly may be deposited and patterned using the teachings of the aforementioned U.S. Pat. No. 5,141,597 to Adams et al. which is hereby incorporated by reference. Thus, FIG. 2 is similar to that of FIG. 4 of Adams et al., with the exception that the poly interconnect regions of Adams et al. are not illustrated in FIG. 2. Further, the resistor poly may reside in a single layer of poly that also contains the gates for the four MOS transistors 22–28 of FIG. 1. Alternately, the resistor poly may reside is a second layer of poly apart from the first layer containing the transistor gates.

Figure 3:
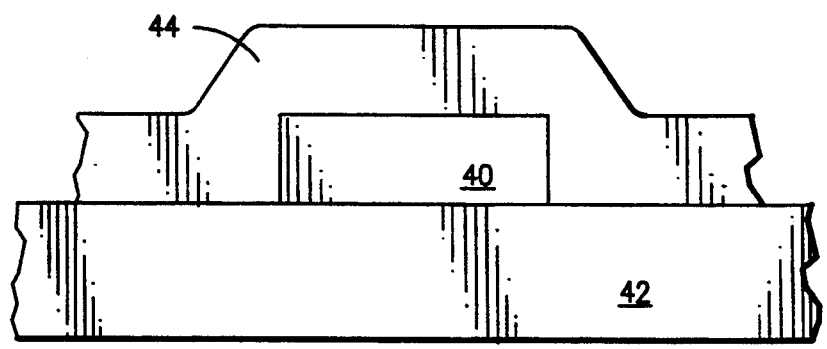
Figure 4:
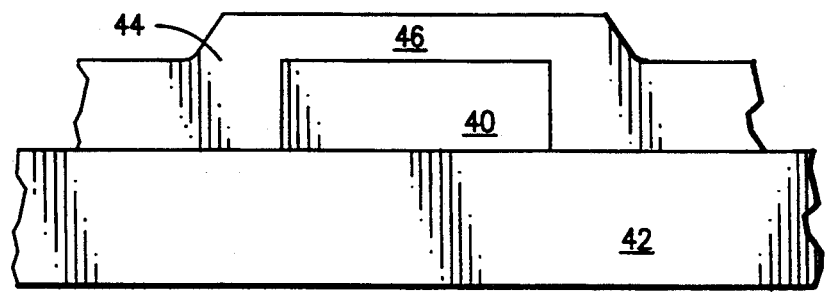

Referring to FIG. 3, a layer of spacer oxide 44 comprising, e.g., silicon oxide, is deposited entirely over the poly region 40 to a thickness of, e.g., 5000 Angstroms. In FIG. 4, the thickness of the spacer oxide layer 44 is etched back (i.e., reduced) in a, e.g., plasma etch step, or other known etch steps. The plasma etch step may utilize a conventional etchant of CF$_4$ or similar plasma at an ambient temperature in the range of 15 degrees C to 100 degrees C. The etch step leaves approximately 2000 Angstroms of spacer oxide remaining in a region 46 on top of the resistor poly.

Figure 5:
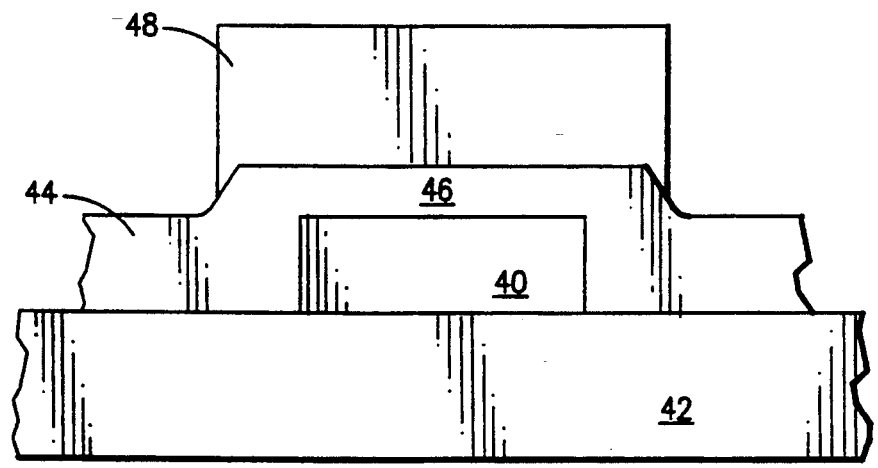
Figure 6:
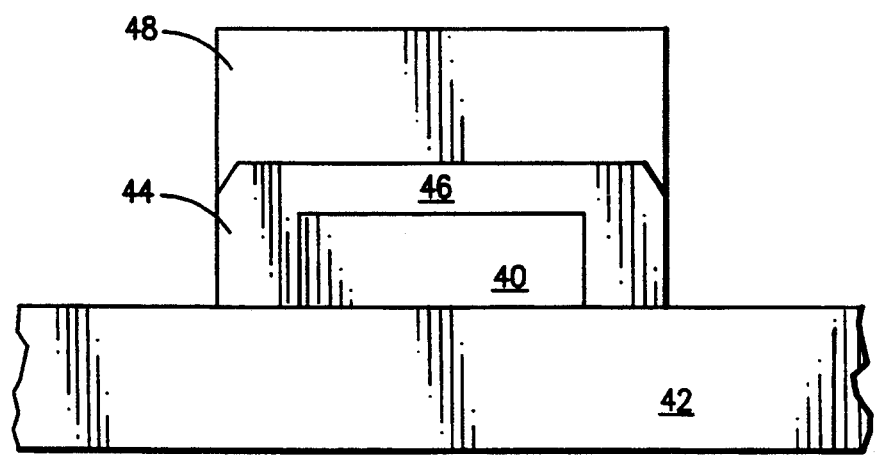
Figure 7:
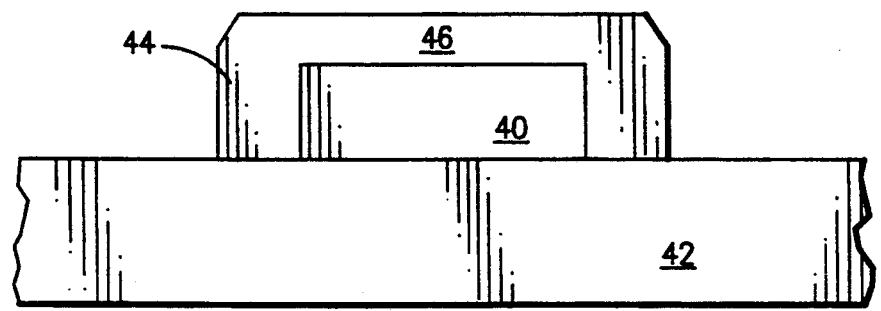

Referring to FIG. 5, the oxide region 46 on top of the resistor poly is covered (masked) with a layer 48 of approximately 1.2 microns of photoresist using, e.g., a known photolithography process. The mask 48 is sized to reduce alignment sensitivity. In FIG. 6, the remaining spacer oxide is etched from the exposed areas in a, e.g., plasma etch step. That is, the oxide 44 is removed in the areas not covered by the photoresist mask 48. The selectivity of this etch step is approximately five to one, oxide to poly. With the resistors so protected by the oxide, no poly is removed in the oxide etch/overetch process, or in any further processing steps. Referring to FIG. 7, photoresist 48 is removed from over the resistor. The resistors have a resulting oxide cap 44 having a thickness that causes no metal layer one step coverage problems later.

The embodiment of the invention has been described with respect to regions of poly, oxide and photoresist of specific thicknesses. However, it is to be understood that the thicknesses indicated are purely exemplary; the broadest scope of the present invention is not limited to those specific thicknesses. Those skilled in the art shall be readily able to apply the concepts of the present invention to other thicknesses.

Further, the present invention has been described with respect to polycrystalline silicon load resistors for use in a SRAM memory cell. However, it is to be understood that the present invention is not limited to such application. The present invention may be used with any type of semiconductor device in which is it necessary to fabricate a region in the polycrystalline silicon having desired characteristics and to maintain those characteristics throughout the remainder of the semiconductor device manufacturing process.

The method of the present invention overcomes the problems with the aforedescribed prior art method. By only removing a portion of the spacer oxide from the poly region, instead of the entire oxide, the present invention assures that no poly is removed, thereby assuring that the desired resistor value is achieved.

Although the invention has been illustrated and described with respect to a best mode embodiment thereof, it should be understood by those skilled in the art that the foregoing and various other changes, omissions, and additions in the form and detail thereof may be made without departing from the invention.

I claim:

1. A method of forming a resistor having a resistivity value substantially immune to subsequent processing, said method comprising the steps of:

forming a resistor region in a layer of polycrystalline silicon, said resistor region being doped to the resistivity value;

forming an insulating oxide layer having a first thickness superjacent said resistor region such that said insulating oxide surrounds said resistor region; and removing an upper portion of said insulating oxide layer such that said first thickness is reduced to a second thickness; and removing a first and a second lateral portion of said insulating oxide layer such that an insulating oxide cap is formed having a top portion and a first and a second side portion, thereby protecting the resistivity value from subsequent processing.

2. The method of claim 1, wherein said step of removing an upper portion of said insulating oxide layer comprises the step of etching away said upper portion of said insulating oxide layer using an etchant.

3. The method of claim 2, wherein said etchant comprises a plasma etchant.

4. The method of claim 3, wherein said step of etching away is performed at an ambient temperature substantially within the range of 15° C. and 100° C.

5. The method of claim 1, wherein said first thickness is approximately 5000 Å and said second thickness is approximately 2000 Å.

6. The method of claim 1, wherein said insulating oxide layer comprises silicon dioxide.

7. The method of claim 1, wherein said step of removing a first and a second lateral portion of said insulating oxide layer comprises the steps of:

covering said top, first and second side portions of said insulating oxide layer with a mask;

removing portions of said insulating oxide layer not covered by said mask; and removing said mask.

8. The method of claim 7, wherein said mask comprises a photoresist.

9. The method of claim 9, wherein said mask is sized to reduce alignment sensitivity.

10. The method of claim 9, wherein said mask comprises an approximate thickness of 1.2 μm.

11. The method of claim 7, wherein said step of removing portions of said insulating oxide layer not covered by said mask comprises the step of etching away said first and said second lateral portions of said insulating oxide layer using an etchant.

12. The method of claim 11, wherein said etchant comprises plasma etchant.

13. The method of claim 12, wherein said step of etching away comprises a selectivity of approximately five parts oxide to one part: polycrystalline silicon.

14. A method of forming a resistor, for use in a static random access memory, having a resistivity value substantially immune to subsequent processing steps, said subsequent processing steps comprising a patterning step and an etching step, said method comprising the steps of:

forming a resistor region within a polycrystalline silicon layer, said resistor region being doped to the resistivity value;

forming an insulating oxide layer having a first thickness superjacent said resistor region such that said insulating oxide surrounds said resistor region; and etching away an upper portion of said insulating oxide layer using a first etchant such that said first thickness is reduced to a second thickness; and etching away a first and a second lateral portion of said insulating oxide layer such that an insulating oxide cap is formed having a top portion and a first and a second side portion, thereby protecting the resistivity value from subsequent processing, said step of etching away a first and a second lateral portion comprising the steps of:

covering said top, first and second side portions of said insulating oxide layer with a photoresist mask;

etching away portions of said insulating oxide layer not covered by said photoresist mask using a second etchant; and removing said photoresist mask.

15. The method of claim 14, wherein said step of etching away an upper portion comprises a plasma etching step performed at an ambient temperature substantially within the range of 15° C. and 100° C.

16. The method of claim 14, wherein said first thickness is approximately 5000 Å and said second thickness is approximately 2000 Å.

17. The method of claim 14, wherein said insulating oxide layer comprises silicon dioxide.

18. The method of claim 14, wherein at least one of said first and second etchants comprises a plasma etchant.

19. The method of claim 14, wherein said step of etching away a first and a second lateral portion of said insulating oxide layer comprises a selectivity of approximately five parts oxide to one part polycrystalline silicon.

20. The method of claim 14, wherein said mask is sized to reduce alignment sensitivity.

* * * * *